(12) United States Patent
Budd et al.

(10) Patent No.: US 10,023,793 B2
(45) Date of Patent: Jul. 17, 2018

(54) PARTICLES WITH QUANTUM DOTS AND METHOD OF MAKING THE SAME

(71) Applicant: 3M INNOVATIVE PROPERTIES COMPANY, St. Paul, MN (US)

(72) Inventors: Kenton D. Budd, Woodbury, MN (US); Neeraj Sharma, Woodbury, MN (US); Bill H. Dodge, Finlayson, MN (US); Daimon K Heller, Houlton, WI (US); Michael A. Haase, St. Paul, MN (US); Mahmut Aksit, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 15/313,671

(22) PCT Filed: May 29, 2015

(86) PCT No.: PCT/US2015/033230
§ 371 (c)(1),
(2) Date: Nov. 23, 2016

(87) PCT Pub. No.: WO2015/187490
PCT Pub. Date: Dec. 10, 2015

(65) Prior Publication Data
US 2017/0190965 A1    Jul. 6, 2017

Related U.S. Application Data

(60) Provisional application No. 62/007,217, filed on Jun. 3, 2014.

(51) Int. Cl.
*C09K 11/02* (2006.01)
*C09K 11/88* (2006.01)
*H01L 33/50* (2010.01)

(52) U.S. Cl.
CPC ............ *C09K 11/02* (2013.01); *C09K 11/025* (2013.01); *C09K 11/883* (2013.01); *H01L 33/502* (2013.01)

(58) Field of Classification Search
CPC ........... B01J 2/02; B01J 2/003; A61K 9/5153; A61K 9/5192
See application file for complete search history.

(56) References Cited

U.S. PATENT DOCUMENTS 7,037,729 B2   5/2006   Nie
7,648,845 B2   1/2010   Nie
(Continued)

FOREIGN PATENT DOCUMENTS

CN    102690658    9/2012

OTHER PUBLICATIONS

Ciriminna, "From Molecules to Systems: Sol-Gel Microencapsulation in Silica-Based Materials", Chem. Rev. 2011, vol. 111, No. 2, pp. 765-789.
(Continued)

*Primary Examiner* — Phuc Dang
(74) *Attorney, Agent, or Firm* — Gregory D. Allen

(57) ABSTRACT

A marker composition and a package using same. The marker composition can include retroreflective particles and a dispersion medium, the blending ratio of the retroreflective particles being from 50 to 90 mass % on the basis of the total marker composition.

15 Claims, 5 Drawing Sheets

(56) References Cited

U.S. PATENT DOCUMENTS

| | | | |
|---|---|---|---|
| 2003/0121544 A1* | 7/2003 | Hirata | G02B 1/116 |
| | | | 136/256 |
| 2006/0019098 A1 | 1/2006 | Chan | |
| 2007/0003694 A1* | 1/2007 | Chiruvolu | B01J 2/02 |
| | | | 427/180 |
| 2010/0224831 A1 | 9/2010 | Woo | |
| 2010/0266491 A1* | 10/2010 | Farokhzad | A61K 9/5153 |
| | | | 424/1.29 |
| 2011/0068322 A1 | 3/2011 | Pickett | |
| 2011/0177306 A1* | 7/2011 | Isojima | A61K 9/1075 |
| | | | 428/203 |
| 2012/0074449 A1 | 3/2012 | Park | |
| 2012/0113672 A1 | 5/2012 | Dubrow | |
| 2014/0128488 A1* | 5/2014 | Lotti | C08J 9/0066 |
| | | | 521/76 |

OTHER PUBLICATIONS

Isnaeni, "Silica encapsulation of toluene soluble quantum dots with high photostability", Journal of Colloid and Interface Science, 2013, vol. 395, pp. 45-49.

Sorensen, "Fabrication of Stable Low-Density Silica Aerogels Containing Luminescent ZnS capped CdSe Quantum Dots", Advanced Material, 2006, vol. 18, pp. 1965-1967.

International Search Report for PCT International Application No. PCT/US2015/033230 dated Aug. 12, 2015, 3 pages.

Wang, "Carbon Quantum Dot-Functionalized Aerogels for $NO_2$ Gas Sensing", Analytical Chemistry, Sep. 3, 2013, vol. 85, No. 17, pp. 8065-8069.

* cited by examiner

PARTICLES WITH QUANTUM DOTS AND METHOD OF MAKING THE SAME

CROSS REFERENCE TO RELATED APPLICATIONS

This application is a national stage filing under 35 U.S.C. 371 of PCT/US2015/033230, filed May 29, 2015, which claims the benefit of U.S. Provisional Application No. 62/007,217, filed Jun. 3, 2014, the disclosure of which is incorporated by reference in its/their entirety herein.

BACKGROUND

Light emitting semiconductor nanoparticles (also known as "quantum dots") such as CdSe or InP are useful as phosphor materials. Uses of quantum dots include backlights for liquid crystal displays (LCD) displays. Light from short wavelength light emitting diodes (LED) is converted to desired visible wavelengths by the quantum dots. For example, a backlight can comprise blue emitting LEDs, and red and green emitting quantum dots that adsorb part of the blue light. Quantum dots can be used to create narrow emission peaks, resulting in displays with high color gamut. 3M markets a remote phosphor diffuser film product (QDEF) (quantum dot enhancement film) using quantum dot emitters. The quantum dots in this product are embedded in a film, which is sandwiched between two sheets of high barrier film to protect the quantum dots from atmospheric components such as oxygen and water vapor. Each sheet of high barrier film has a high barrier thin film metal oxide coating.

SUMMARY

In one aspect, the present disclosure describes a particle comprising a composite core and a continuous inorganic coating (e.g., non-optically absorbing material that absorbs less than 20% of the light energy (i.e., wavelength in the range from 460 nm to 720 nm) emitted by the quantum dots) covering the composite core, wherein the composite core comprises a continuous non-metallic inorganic matrix, ligands, and quantum dots, wherein the matrix comprises up to 40 (in some embodiments, up to 35, 30, 25, or even up to 20; in some embodiments, in a range from 5 to 40, 5 to 30, or even 5 to 20) volume percent, and wherein the coating has an average thickness up to 5 micrometers (in some embodiments, up to 4 micrometers, 3 micrometers, 2 micrometers, 1 micrometer, 750 nm, 500 nm, 250 nm, 100 nm, or even up to 50 nm; in some embodiments, in a range from 5 nm to 500 nm, 10 nm to 500 nm, or even 25 nm to 500 nm). In some embodiments, the particle has air stable light emission properties (i.e., has at least an emission intensity after 1000 hours of at least 70% (in some embodiments, at least 80% or even at least 90%) of the peak emission intensity as determined by the Ambient Life Test in the Examples).

In another aspect, the present disclosure describes a method of making a particle described in the preceding paragraph, the method comprising:

providing a liquid having quantum dots dispersed therein;
infiltrating the liquid having the quantum dots into a porous inorganic particle; and
encapsulating the infiltrated particle with a continuous inorganic (e.g., non-optically absorbing) coating to provide a particle.

Particles described here are useful, for example, to make articles (e.g., film). Unlike conventional film products having the quantum dots embedded therein, where the film is sandwiched between two high barrier film sheets to protect the quantum dots from atmospheric components such as oxygen and water vapor, where each high barrier film sheet has an inorganic (e.g., metal oxide) high barrier coating, such film constructions having particles described herein embedded therein do not need to be sandwiched between the two high barrier film sheets. The single layer construction option offered by using particles described herein addresses several problems associated with conventional constructions, and hence provides several advantages over such conventional constructions, including elimination of edge ingress, reduction of thickness, potentially lower cost, ability to do film making in normal ambient conditions, and selection of film material for manufacturing and use properties (independent of compatibility with quantum dots, ingress properties, etc.). In addition, particles as described herein can be used in combination with high barrier film (i.e., a polymer film with a continuous inorganic barrier layer that results in air stable light emission properties (i.e., has at least an emission intensity after 1000 hours of at least 70% (in some embodiments, at least 80% or even at least 90%) of the peak emission intensity as determined by the Ambient Life Test in the Examples) when a quantum dot containing layer is sandwiched between sheets of the high barrier film. Such a construction can mitigate the effects of defects in either the film or the set of particles, resulting in high product yields. Further, although certain composite particles containing quantum dots are described in the art, particles useful in, for example, photoluminescent film products for LCD displays, desirably exhibit a unique combination of properties for maximum utility. In some embodiments, the particles exhibit high efficiency and stable long term light energy output, and also desirable color, brightness, and uniformity with practical film loading levels and cost. Hence the particles desirably have high barrier encapsulation, a high loading of quantum dots, provide a desirable chemical environment for the quantum dots, and have little or no detrimental poisons within the particle core or coating. In addition, in embodiments, the processes to make the particles have minor or negligible effects on the properties of the quantum dots embedded in the particles.

DETAILED DESCRIPTION

Figure 9:
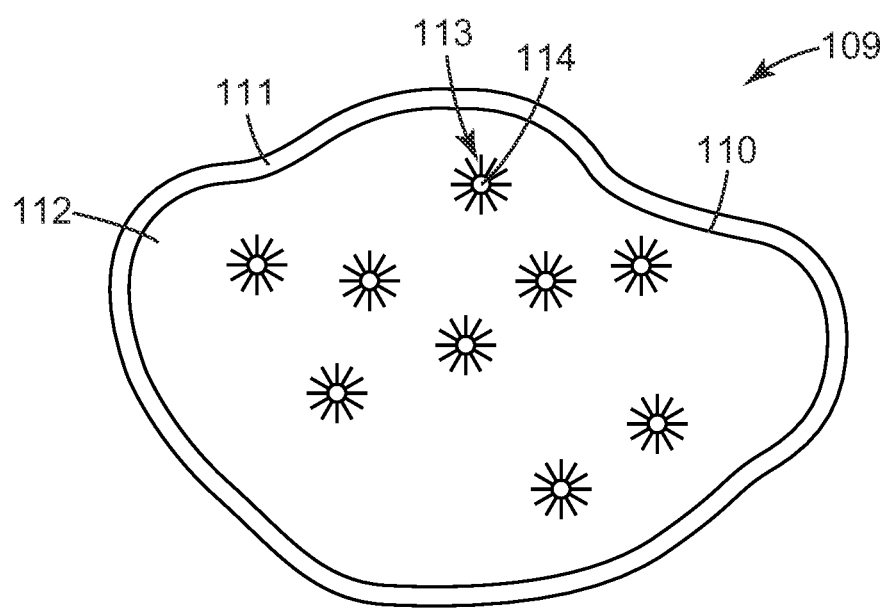
FIG. 9 is a sketch of an exemplary particle described herein.

Referring to FIG. 9, particle described herein 109 has composite core 110 and continuous inorganic coating 111.

Composite core 110 has continuous non-metallic inorganic matrix 112, ligands 113, and quantum dots 114.

In some embodiments, encapsulating the infiltrated particle with a continuous inorganic coating is done via at least one of vapor deposition (including chemical vapor deposition (CVD) (including atmospheric pressure chemical vapor deposition (APCVD), hydrolysis CVD, and plasma CVD)), atomic layer deposition (ALD), sputtering, or evaporation, which are techniques well known in the art.

Advantages of vapor deposition techniques for providing the coatings include that the coating is built up from molecular size species without interference from a solvent or liquid media. Some coating methods (e.g., ALD and CVD) tend to provide coatings composed of conformal layers on irregular materials (e.g., powder or porous particulate).

ALD and CVD are coating processes involving chemical reactions, where the chemical reactants used are referred to as chemical precursors. That is, they are precursors to the coating material (i.e., coating precursors) to be formed (e.g., a metal oxide coating). In some embodiments, a single coating precursor is used, while in other embodiments, at least two coating precursors are used. At least one coating precursor comprises at least one metal cation needed for the coating (e.g., a metal oxide coating).

A single coating precursor may be used when simple decomposition of the precursor (e.g., thermal decomposition or plasma enhanced decomposition) is sufficient to form a coating. At least two coating precursors (e.g., metal oxide precursors) are used when at least one coating precursor comprises at least one metal cation and chemically reacts with at least one additional precursor (i.e., a co-reactant) to form a coating (e.g., a metal oxide coating). The additional coating precursor is a co-reactant to the coating precursor comprising at least one metal cation. A co-reactant(s) chemically reacts with a coating precursor comprising at least one metal cation to form a coating.

ALD coatings are generally deposited one monolayer at a time via alternate pulses of a chemical precursor (e.g., a coating precursor comprising at least one metal cation), absorption of a monolayer of the precursor, removal of excess precursor, and pulsing of a co-reactant (e.g., a co-reactant to the coating precursor comprising at least one metal cation). As such, these coatings tend to be conformal and uniform. Alternatively, for example, ALD systems can also deposit thicker, non-self limiting coatings wherein significantly greater than a monolayer of each chemical reactant adsorbs into a substrate during each pulse or cycle, and results in the deposition of much larger amounts of coating.

CVD coatings can involve similar chemical reactions, but both precursors are typically supplied concurrently and continuously. Uniformity can be enhanced with continuous mixing of a powder being coated. Fabrication of composite particles having high photoluminescent efficiency requires process methods and conditions that do not damage the quantum dot particles.

A surprisingly effective coating method for making particles described herein is atmospheric pressure CVD (APCVD). APCVD can be carried out in simple equipment such as glassware. In some embodiments, hydrolysis reactions are used to form metal oxide coatings at moderate temperatures (e.g., 100° C. to 130° C.), although some hydrolysis reactions are carried out at slightly higher temperatures as well (e.g., 130° C.-220° C.). In addition, atmosphere pressure conditions, in combination with nanoporous core materials, can be effective in maintaining liquid within the composite particles, and protecting quantum dots within the particles from reacting with air, precursors, or reaction products associated with the CVD process. APCVD facilitates making particles described herein containing volatile liquids (i.e., liquids that otherwise would be volatized and hence removed when exposed to a vacuum environment associated with some other processes). Exemplary precursors for ALD and CVD processes include coating precursors (e.g., metal oxide precursors) comprising at least one metal cation such as metal alkyls (e.g., trimethyl or triethyl aluminum, diethyl zinc), volatile metal chlorides (titanium tetrachloride, silicon tetrachloride, aluminum trichloride), silane, metal alkoxides (titanium isopropoxide, aluminum isopropoxide, silicon ethoxide), compounds with mixed alkyl, halide, hydride, alkoxy, and other groups, and other volatile metallorganic compounds. Exemplary co-reactants to the coating precursor comprising at least one metal cation (e.g., a metal oxide precursor comprising at least one metal cation) include water, oxygen, ozone, ammonia, and alkyl amines. In addition to metal oxides, other inorganic, nonmetallic coating materials are deposited using chemical reactions between a coating precursor and a co-reactant to the coating precursor (e.g., a metal nitride coating deposited using a metal nitride precursor comprising at least one metal cation and a co-reactant to the metal nitride precursor).

In some embodiments, encapsulating the infiltrated particle with a continuous coating is done via chemical vapor deposition (CVD) not exceeding a temperature of CVD carried out at less than 150° C. (in some embodiments, less than 125° C.). In some embodiments, encapsulating the infiltrated particle with a continuous coating is done via chemical vapor deposition (CVD) not exceeding a temperature of 200° C.

In some embodiments, encapsulating the infiltrated particle with the inorganic high barrier coating is done at a pressure of at least 0.5 atmosphere.

Exemplary continuous coatings comprise, for example, nonmetallic, inorganic materials such as silica, metal (e.g., Al, Si, Ti, Zr, Mg, and Zn) oxides, metal nitrides, metal sulfides, metal oxysulfides, and metal oxynitrides. Exemplary metal oxides include forms such as hydroxides, and hydrous oxides, as well as forms with mixed anions (e.g., oxide plus halides, hydroxyls, small amounts of alkyls or carboxylates, etc.). The coatings can be amorphous, crystalline or mixed, single or multiphase, and can contain one or more cations and one or more anions. In some embodiments, the coating is amorphous alumina with or without some hydroxyls or bound water.

In some embodiments, encapsulating the infiltrated particle with a continuous coating is done via an APCVD coating process, wherein an alumina based coating is provided using trimethyl aluminum (TMA) and water. Precursors can be introduced into a reaction chamber by flowing a carrier gas through a bubbler of each liquid precursor. Generally, as is typical for CVD processes, the carrier gases with each component are delivered concurrently and continuously into the reaction chamber. Desirable flow rates and ratios can be adjusted to produce desired amounts and characteristics of coatings. In some embodiments, flows of either precursor can be initiated or maintained individually for a period of time wherein no flow of the other precursor is present. In some embodiments, the flows of precursors can be changed or adjusted one or more times throughout a process. Such changes can enable favorable usage of conditions which are least harmful to quantum dot properties, and other conditions which provide more desirable coating characteristics when such conditions conflict.

In some embodiments, the ratio of a co-reactant (e.g., water) to a coating precursor comprising at least one metal cation (e.g., TMA) is higher initially than later in a process. In other embodiments, the ratio of a co-reactant (e.g., water) to a coating precursor comprising at least one metal cation is lower initially than later in a process. In some embodiments, composite particles are exposed to only a co-reactant (e.g., water) for an initial period prior to exposure to a coating precursor comprising at least one metal cation. In some embodiments, composite particles are exposed to only a coating precursor comprising at least one metal cation prior to exposure to a second reactant (e.g., a co-reactant to the coating precursor). Surprisingly, both the efficiency and the air stability of composite particles can be significantly improved using such initial exposures. In some embodiments, different flow conditions are maintained for at least 5 min (or in other embodiments, at least 10, 15, 20, 30, 45, 60, or 90 minutes).

In some embodiments, a coating of a first composition is deposited, followed by a coating of a second composition. For example, an alumina based coating can be deposited from TMA and water, followed by a titania based coating deposited from $TiCl_4$ and water.

Quantum dots are commercially available, for example, from Nanosys, Inc., Milpitas, Calif., and are typically provided with the quantum dots in a liquid (e.g., a solvent such as toluene, or a liquid ligand system). In some embodiments, the quantum dots comprise at least one of ZnS, ZnSe, CdS, CdSe, PbS, InP, InAs, GaAs, GaP, Si, or Ge. In some embodiments, the quantum dots comprise CdSe or InP nanoparticles. Typically, the quantum dots comprise so-called core-shell structures, with a core of the desired semiconductor nanoparticle, and at least one shell of additional material that provides desired stability and surface chemical or electronic properties. Exemplary materials include CdSe core—CdS intermediate layer. In one embodiment, the quantum dots have a CdSe core, a ZnSe middle layer, and a ZnS shell. In another embodiment, the structure is an InP core—ZnSe intermediate—ZnS shell. It is to be understood there is a distinct difference between the core of a quantum dot (typically less than 4 nm in diameter), and the core region of the composite particles described herein (typically at least micrometers or tens of micrometers in diameter). In some embodiments, the porous inorganic particle and the matrix of the core particles comprises at least one of silica, metal (e.g., Al, Ti, Zr, Mg, and Zn) oxide, metal nitride, metal sulfide, metal oxysulfide, or metal oxynitride. Exemplary metal oxides include forms such as hydroxides, hydrous oxides, and as well as forms with mixed anions (e.g., oxide plus halides, hydroxyls, small amounts of alkyls or carboxylates, etc.). The porous inorganic particle and the matrix of the core particles can be amorphous, crystalline, or mixed, single or multiphase, and can contain one or more cations and one or more anions, mixed oxides, hydrous oxides. In some embodiments, the matrix is continuous. The porous inorganic particles can be made by techniques known in the art. For example, chemically derived porous metal oxide particles can be made by growth from alkoxide solutions or nanoparticle sols. Exemplary methods also include emulsion processes, or atomization of aqueous chemical precursors into oils or gelling media (see, e.g., "From Molecules to Systems: Sol-Gel Microencapsulation in Silica-Based Materials," Rosaria Ciriminna, Marzia Sciortino, Giuseppe Alonzo, Ater de Schrijver, and Mario Pagliaro, *Chem. Rev.*, 2011, 111 (2), pp 765-789). Dried chemically derived particles are sometimes called xerogels.

Xerogel particles can be heated to remove residual solvents and organics, but should be processed at temperatures such that sufficient sintering does not occur to eliminate desired porosity.

In some embodiments, the particles are aerogel granules. Aerogels have very high pore volume (e.g., 60%-95%) and very fine pores (e.g., 5 nm-100 nm in diameter). Aerogels are formed by processing gels so as to remove solvent without inducing shrinkage or collapse of the structure as would normally occur due to surface tension forces. The surfaces of aerogels may be treated with a desired functionality (e.g., a hydrophobic functional group). Pre-formed porous particles (e.g., pre-formed aerogels) provide the advantage of not exposing quantum dots to the aerogel synthesis process. Other useful pre-formed porous particles include those known in the art, for example, as chromatography media.

Porous inorganic particles can be formed by techniques known in the art. For example, fine powders of desired materials can be formed into agglomerate particles (e.g., by spray drying), and partially sintered to yield porous particles.

In some embodiments, the matrix comprises up to 40 (in some embodiments, up to 35, 30, 25, or even up to 20; in some embodiments, in a range from 5 to 40, 5 to 30, or even 5 to 20) volume percent of the respective porous inorganic particle.

In some embodiments, the inorganic matrix has a hydrophobic surface. The surface of inorganic matrix can be made hydrophobic, for example, by treatment with a silane or other agent with a hydrophobic group. In some embodiments, the surface of an inorganic matrix is untreated, with neutral or hydrophilic characteristics.

In some embodiments, the porous inorganic particles (prior to filling with quantum dots and ligand systems) are greater than 50 (in some embodiments, at least 55, 60, 70, or even at least 75; in some embodiments, in a range from 50 to 75, or even 60 to 90) volume percent porous. In some embodiments, the porous inorganic particles comprise a mesoporous structure. In some embodiments the porous inorganic particles have an average pore size, if components of the composite core other than the matrix were not present, of not greater than 250 nm (in some embodiments, not greater than 200 nm, 150 nm, 100, nm, 75 nm, 50 nm, 25 nm, or even not greater than 10 nm; in some embodiments, in a range from 5 nm to 250 nm, 5 nm to 200 nm, 5 nm to 150 nm, 5 nm to 100 nm, 5 nm to 75 nm, 5 nm to 50 nm, 5 nm to 25 nm, or even 10 nm to 100 nm).

Quantum dots (light emitting semiconductor nanoparticles) typically have selected molecules, oligomers, or polymers bound to their surfaces, resulting in a desirable local ligand environment for atoms at the surfaces of the quantum dots. Generally, certain ligands are present during the growth process used to synthesize the quantum dots. Often, these ligands are replaced or exchanged at a later time to provide a new ligand environment selected to optimize properties. Ligands perform several functions. They help prevent quantum dots from clustering and quenching, they can improve the chemical stability of the quantum dot surface, and they can improve the emission efficiency of the quantum dots. Ligand systems can include several forms. In general, they can include molecules or functional groups directly bound to quantum dots, and optionally, additional material. The additional material can be liquid or solid, and can be the same composition or a different composition compared to the bound material (e.g., a ligand system could comprise a bound species and a solvent).

An example of a ligand system for CdSe-based quantum dots is a liquid aminosilicone type oil with both bound material and additional material of similar composition. An example of a ligand system for InP-based quantum dots is bound medium chain carboxylic acid species with a solid polymer (e.g., isobornyl methacrylate) as an additional material, or with carboxylate groups in the polymer bonded to the quantum dots as well. Composite particles described herein can be advantageous in that they can maintain a desirable ligand environment, including an environment comprising a liquid ligand system or solvent. Surprisingly, even when a particle core is greater than 50 volume % liquid, confinement within a nanoporous matrix can enable deposition of a high barrier inorganic thin film coating directly onto the liquid filled core. Exemplary desirable properties of ligand systems for composite particles and processes include stability at process temperatures and favorable infiltration behavior. Surprisingly, CdSe based quantum dots in an aminosilicone oil ligand system infiltrate readily into both hydrophobic treated porous silica particles, and untreated hydrophilic silica particles. In addition, these materials have been found to be stable to process temperatures of at least 200° C.

In some embodiments, the ligand system can be a liquid at the time of infiltration, and subsequently converted to a solid by curing, polymerization, or solvent removal.

Infiltration of a liquid containing quantum dots into a porous matrix can be done by mixing particles or granules of porous matrix material with the liquid. In some embodiments, the volume of liquid is chosen to be a large fraction of the available pore volume (e.g., the volume of liquid is 50 to 99% of the pore volume). In some embodiments, wherein the quantum dots are in a viscous liquid ligand system, a solvent can be used to facilitate infiltration. Optionally, the solvent can be removed by, for example, vacuum drying, following infiltration. In some embodiments, the matrix material can be chosen or designed such that some shrinking occurs during drying, resulting in a composite particle with a high fill fraction.

In some embodiments, grinding is desirable after infiltration. Grinding can be done using common grinding or milling methods in an inert atmosphere.

In some embodiments, at least 60 (in some embodiments, at least 65, 70, 75, 80, 85, or even at least 90; in some embodiments, in a range from 60 to 95, or even 70 to 95) volume percent of the particle is collectively the ligands and the quantum dots, based on the total volume of the composite core.

In some embodiments, the composite core further comprises a liquid (e.g., a non-volatile liquid (e.g., aminosilicone oil)). In some embodiments, greater than 50 (in some embodiments, at least 55, 60, 70, or even at least 75; in some embodiments, in a range from 50 to 75, or even 60 to 95) volume percent of the particle is collectively the liquid, the ligands, and the quantum dots, based on the total volume of the composite core. In some embodiments, greater than 50 (in some embodiments, at least 55, 60, 65, 70, or even at least 75; in some embodiments, in a range from 50 to 75, or even 60 to 90) weight percent of the particle is collectively the liquid, the ligands, and the quantum dots, based on the total weight of the composite core. In some embodiments, the quantum dots, the ligands, and the liquid are in the form of a liquid-ligand system.

In some embodiments, the ligands include at least one of an amine functional silicone, a carboxylic acid functional silicone, a bound ligand plus a solvent or carrier liquid, and a curable component.

In some embodiments, the composite core further comprises a polymer. In some embodiments, the polymer is at least one of an acrylate or an epoxy.

In some embodiments, greater than 50 (in some embodiments, at least 55, 60, 70, or even at least 75; in some embodiments, in a range from 50 to 75, or even 60 to 95) volume percent of the particle is collectively the liquid, the ligands, the polymer, and the quantum dots, based on the total volume of the composite core. In some embodiments, greater than 50 (in some embodiments, at least 55, 60, 70, or even at least 75; in some embodiments, in a range from 50 to 75, or even 60 to 90) weight percent of the particle is collectively the liquid, the ligands, the polymer, and the quantum dots, based on the total weight of the composite core.

In some embodiments, the coating comprises at least one form selected from the group consisting of amorphous, crystalline, hydroxide, hydrous oxide, anhydrous oxide, and combinations thereof. In some embodiments, the coating comprises at least one oxide comprising at least one of Al, Si, Ti, Zr, or Mg.

In some embodiments, the inorganic high barrier coating has an average thickness up to 5 micrometers (in some embodiments, up to 4 micrometers, 3 micrometers, 2 micrometers, 1 micrometer, 750 nm, 500 nm, 250 nm, 100 nm, or even up to 50 nm; in some embodiments, in a range from 5 nm to 500 nm, 10 nm to 500 nm, or even 25 nm to 500 nm). In some embodiments, the coating at least partially penetrates into the composite core.

In some embodiments, the particle has air stable photoluminescent efficiency. (i.e., has an external quantum efficiency after 1000 hours of at least 70% (in some embodiments, at least 80% or even at least 90%) of the peak external quantum efficiency as determined by the Ambient Life Test in the Examples in combination with an external quantum efficiency measurement as described in the Examples taken at time zero and taken or inferred after 1000 airs of excitation). In some embodiments, the particle has air stable photoluminescent emission. (i.e., has an emission intensity after 1000 hours of at least 70% (in some embodiments, at least 80% or even at least 90%) of the peak emission intensity as determined by the Ambient Life Test in the Examples).

In some embodiments, the particles described herein are in a range from 10 micrometers to 100 micrometers (in some embodiments, in a range from 20 micrometers to 50 micrometers).

Particles described herein can be incorporated into articles such as films. In some embodiments, the film exhibits external quantum efficiencies greater than 50 (in some embodiments greater than 65, 70, 75, 80, 85, or even greater than 90, in some embodiments, in a range from greater than 50 to 90). Although not wanting to be bound by theory, external quantum efficiencies of films are typically lower than dilute solution quantum yield values for the quantum dots used in a film, due to scattering and reabsorption of light. Generally, quantum dots with quantum yield values above 90% correspond to a film external quantum efficiency above 80%, for example. In some embodiments, the film has an average thickness in a range from 5 micrometers to 500 micrometers (in some embodiments, in a range from 10 micrometers to 250 micrometers, or even 25 micrometers to 100 micrometers). In some embodiments of the film comprises at least 1 (in some embodiments, at least 5, or even at least 10; in some embodiments, in a range from 1 to 25, or even 2 to 10) volume percent composite particles, based on the total volume of the film. In some embodiments, the film comprises a sufficient amount of the particles to provide an optical density in a range from 0.05 to 0.80 (in some embodiments, in a range from 0.10 to 0.50; or even 0.15 to 0.25). In some embodiments, the film further comprises polymer (e.g., epoxies or acrylates).

EXEMPLARY EMBODIMENTS

1A. A particle comprising a composite core and a continuous inorganic coating (e.g., non-optically absorbing) covering the composite core, wherein the composite core comprises a continuous non-metallic inorganic matrix, ligands, and quantum dots, wherein the matrix comprise up to 40 (in some embodiments, up to 35, 30, 25, or even up to 20; in some embodiments, in a range from 5 to 40, 5 to 30, or even 5 to 20) volume percent, and wherein the coating has an average thickness up to 5 micrometers (in some embodiments, up to 4 micrometers, 3 micrometers, 2 micrometers, 1 micrometer, 750 nm, 500 nm, 250 nm, 100 nm, or even up to 50 nm; in some embodiments, in a range from 5 nm to 500 nm, 10 nm to 500 nm, or even 25 nm to 500 nm).

2A. The particle of Exemplary Embodiment 1A, wherein the matrix comprises at least one of silica or metal oxide (e.g., at least one oxide of Al, Si, Ti, Zr, Mg, or Zn).

3A. The particle of any preceding A Exemplary Embodiment, wherein at least 60 (in some embodiments, at least 65, 70, 75, 80, 85, or even at least 90; in some embodiments, in a range from 60 to 95, or even 70 to 95) volume percent of the particle is collectively the ligands and the quantum dots, based on the total volume of the composite core.

4A. The particle of any preceding A Exemplary Embodiment, wherein the matrix is aerogel.

5A. The particle of any preceding A Exemplary Embodiment, wherein the matrix is chromatography media.

6A. The particle of any preceding A Exemplary Embodiment, wherein the composite core further comprises a liquid.

7A. The particle of Exemplary Embodiment 6A, wherein the liquid is a non-volatile liquid (i.e., has a vapor pressure at 25° C. of up to 1 torr).

8A. The particle of Exemplary Embodiment 6A, wherein the liquid is a volatile liquid (i.e., has a vapor pressure at 25° C. of greater than 1 torr (in some embodiments, at least 5, or even at least 10 torr)).

9A. The particle of Exemplary Embodiments 6A to 8A, wherein greater than 50 (in some embodiments, at least 55, 60, 70, or even at least 75; in some embodiments, in a range from 50 to 75, or even 60 to 95) volume percent of the particle is collectively the liquid, the ligands, and the quantum dots, based on the total volume of the composite core.

10A. The particle of Exemplary Embodiments 6A to 9A, wherein greater than 50 (in some embodiments, at least 55, 60, 65, 70, or even at least 75; in some embodiments, in a range from 50 to 75, or even 60 to 90) weight percent of the particle is collectively the liquid, the ligands, and the quantum dots, based on the total weight of the composite core.

11A. The particle of Exemplary Embodiments 6A to 10A, wherein the quantum dots, the ligands, and the liquid are in the form of a liquid-ligand system.

12A. The particle of any preceding A Exemplary Embodiment, wherein the ligands include at least one of an aminosilicone or a carboxylic acid functional polymer.

13A. The particle of any preceding A Exemplary Embodiment, wherein the quantum dots comprise at least one of ZnS, ZnSe, CdS, CdSe, PbS, InP, InAs, GaAs, GaP, Si, or Ge.

14A. The particle of any preceding A Exemplary Embodiment, wherein the quantum dots comprise CdSe or InP nanoparticles.

15A. The particle of any preceding A Exemplary Embodiment, wherein the composite core further comprises a polymer.

16A. The particle of Exemplary Embodiment 15A, wherein the polymer is at least one of an acrylate or an epoxy.

17A. The particle of either Exemplary Embodiment 15A or 16A, wherein greater than 50 (in some embodiments, at least 55, 60, 70, or even at least 75; in some embodiments, in a range from 50 to 75, or even 60 to 95) volume percent of the particle is collectively the liquid, the ligands, the polymer, and the quantum dots, based on the total volume of the composite core.

18A. The particle of Exemplary Embodiment 16A or 17A, wherein greater than 50 (in some embodiments, at least 55, 60, 70, or even at least 75; in some embodiments, in a range from 50 to 75, or even 60 to 90) weight percent of the particle is collectively the liquid, the ligands, the polymer, and the quantum dots, based on the total weight of the composite core.

19A. The particle of any preceding A Exemplary Embodiment, wherein the coating at least partially penetrates into the composite core.

20A. The particle of any preceding A Exemplary Embodiment, wherein the composite core comprises a mesoporous structure.

21A. The particle of any preceding A Exemplary Embodiment, wherein the matrix has an average pore size, if components of the composite core other than the matrix were not present, is not greater than 250 nm (in some embodiments, not greater than 200 nm, 150 nm, 100, nm, 75 nm, 50 nm, 25 nm, or even not greater than 10 nm; in some embodiments, in a range from 5 nm to 250 nm, 5 nm to 200 nm, 5 nm to 150 nm, 5 nm to 100 nm, 5 nm to 75 nm, 5 nm to 50 nm, 5 nm to 25 nm, or even 10 nm to 100 nm).

22A. The particle of any preceding A Exemplary Embodiment, wherein the coating comprises at least one form selected from the group consisting of amorphous, crystalline, hydroxide, hydrous oxide, anhydrous oxide, and combinations thereof.

23A. The particle of any preceding A Exemplary Embodiment, wherein the coating comprises at least one oxide comprising at least one of Al, Si, Ti, Zr, or Mg.

24A. The particle of any preceding A Exemplary Embodiment, wherein the inorganic matrix has a hydrophobic surface.

25A. The particle of any preceding A Exemplary Embodiment, wherein the inorganic matrix has a hydrophillic surface.

26A. The particle of any preceding A Exemplary Embodiment, wherein the inorganic matrix has an untreated metal oxide surface.

27A. The particle of any preceding A Exemplary Embodiment, wherein the particle has air stable light emission properties.

28A. The particle of any preceding A Exemplary Embodiment, wherein the particle has air stable photoluminescent efficiency.

1B. A plurality of the particles of any A Exemplary Embodiment.

2B. The plurality of the particles of Exemplary Embodiment 1B, wherein the particles are in a range from 10 micrometers to 100 micrometers (in some embodiments, in a range from 20 micrometers to 50 micrometers).

1C. An article comprising particles of any B Exemplary Embodiment.

2C. The article of Exemplary Embodiment 1C that is a film.

3C. The film comprising the particle of Exemplary Embodiment 2C, wherein the film exhibits external quantum efficiencies greater than 50 (in some embodiments greater than 65, 70, 75, 80, 85, or even greater than 90, in some embodiments, in a range from greater than 50 to 90).

4C. The film of either Exemplary Embodiment 2C or 3C having an average thickness in a range from 5 micrometers to 500 micrometers (in some embodiments, in a range from 10 micrometers to 250 micrometers, or even 25 micrometers to 100 micrometers).

5C. The film of Exemplary Embodiments 2C to 4C, wherein at least 1 (in some embodiments, at least 5, or even at least 10; in some embodiments, in a range from 1 to 25, or even 2 to 10) volume percent composite particles, based on the total volume of the film.

6C. The film of Exemplary Embodiments 2C to 5C comprising a sufficient amount of the particles to provide an optical density in a range from 0.05 to 0.80 (in some embodiments, in a range from 0.10 to 0.50; or even 0.15 to 0.25).

7C. The film of Exemplary Embodiments 2C to 6C further comprising polymer.

8C. The film comprising the particle of Exemplary Embodiment 2C, wherein the film further comprises high barrier substrate film.

1D. A method of making a particle of Exemplary Embodiments 1A to 28A, the method comprising:
providing a liquid having quantum dots dispersed therein;
infiltrating the liquid having the quantum dots into a porous inorganic particle; and
encapsulating the infiltrated particle with a continuous inorganic coating to provide the particle.

2D. The method of Exemplary Embodiment 1D, wherein encapsulating the infiltrated particle with an inorganic high barrier coating is done via at least one of vapor deposition (including chemical vapor deposition (CVD) (including atmospheric pressure chemical vapor deposition (APCVD), hydrolysis CVD, and plasma CVD), atomic layer deposition (ALD), sputtering, or evaporation).

3D. The method of either Exemplary Embodiment 1D or 2D, wherein encapsulating the infiltrated particle with an inorganic high barrier material coating is done via chemical vapor deposition (CVD) not exceeding a temperature of CVD of 150° C. (in some embodiments, less than 125° C.).

4D. The method of either Exemplary Embodiment 1D or 2D, wherein encapsulating the infiltrated particle with an inorganic high barrier material coating is done via chemical vapor deposition (CVD) not exceeding a temperature of CVD of 220° C. (in some embodiments, less than 200° C.).

5D. The method of any preceding D Exemplary Embodiment, wherein encapsulating the infiltrated particle with the inorganic high barrier coating is done at a pressure of at least 0.5 atmosphere.

6D. The method of any preceding D Exemplary Embodiment, wherein the particle is a particle of any A Exemplary Embodiment.

7D. The method of exemplary embodiments 2D to 6D, wherein the deposition includes reacting a coating precursor comprising at least one metal cation and a co-reactant to the coating precursor and wherein the ratio of coating precursor to the co-reactant is changed (i.e., increased or decreased) at least once during the process.

8D. The method of exemplary embodiment 7D, wherein the deposition includes exposing the particle to only the coating precursor in the absence of the co-reactant.

9D. The method of either exemplary embodiment 7D or 8D, wherein the deposition includes exposing the particle to only the co-reactant in the absence of the coating precursor.

10D. The method of exemplary embodiments 2D to 9D, wherein the co-reactant is water.

11D. The method of exemplary embodiments 2D to 10D, wherein the coating precursor is trimethyl aluminum.

12D. The method of exemplary embodiments 2D to 11D, wherein any initial or changed flow conditions are maintained for at least 5 minutes (some embodiments, at least 10, 15, 20, 30, 45, 60, or even at least 90 minutes).

13D. The method of exemplary embodiments 7D to 12D, wherein the coating precursor is a metal oxide precursor.

Advantages and embodiments of this invention are further illustrated by the following examples, but the particular materials and amounts thereof recited in these examples, as well as other conditions and details, should not be construed to unduly limit this invention. All parts and percentages are by weight unless otherwise indicated. All the preparations unless mentioned were carried out in a Standard Glove Box under nitrogen atmosphere.

Comparative Example A

A quantum dot concentrate of green CdSe based core-shell quantum dots with an aminosilicone oil based ligand chemistry obtained as part # QCG1964-01, lot #QCG 051413-01 from Nanosys, Inc., Milpitas, Calif. The concentration of emitters was based on the relative optical density of standard layers. A concentrate optical density of 40/mm corresponded to a solution of about 12%-20% semiconductor nanoparticles, which when loaded into epoxy resin as described below at 5 weight % and coated at a film thickness of 100 micrometers resulted in an optical density of 0.20 for the coating. Note that coating optical density is affected in part by diffuse scattering within the layer.

A film sample containing 5 weight % of the concentrate was fabricated as follows. 0.09 gram of green quantum dot concentrate was mixed with 0.34 gram of Part B resin (diamine) of a two part epoxy resin (obtained under the trade designation "EPIC 91B" from Epic Resins, Palmyra, Wis.) and 0.74 gram Part A (obtained under the trade designation "EPON 824 from Momentive, Columbus, Ohio)+15% (obtained under the trade designation "SR348" from Sartomer, Exton, Pa.) resin in a glass vial. The mixture was coated at a thickness of 100 micrometers (4 mils) between two sheets of 50 micrometers thick polyethylene terephthalate (PET) substrate film. The total thickness of films plus coated layer was 200 micrometers (8 mils). The coatings were UV cured using 385 nm light emitting diodes (LED) light source obtained under the trade designation ("CLEARSTONE TECH CF2000 100-240V 6.0-3.5 A 50-60 Hz" from Clearstone Technologies Inc., Hopkins, Minn.) for 30 seconds at 50% power. Following the UV-curing, the coatings were further cured in an oven for 10 minutes at 100° C.

An ambient life test ("Ambient Life Test") was used to determine the extent of air stability/instability. Samples were cut from laminated films of quantum dot materials and placed in contact with the silicone lens of blue light emitting diodes (LEDs) (obtained under the trade designation "LUMILEDS ROYAL BLUE LXML-PRO2" from Philips Limileds, San Jose, Calif.). The LEDs were well heat-sinked, and operated at 20 mA providing about 25 mW of blue light with a center wavelength of 445 nm. This operating point was a small fraction of the rated current of 700 mA, at which the LEDs are expected to have lifetimes in excess of 50,000 hours to 70% brightness. For the test, the illuminated area of the film is estimated to be 16 mm$^2$, the average blue flux is roughly 160 mW/cm$^2$. The temperature of the quantum dot film was assumed to be only slightly above room temperature. The LEDs were operated continuously for the test. The emitted spectrum from each sample (and LED) was acquired daily with a calibrated an integrating sphere, fiber-coupled spectrometer (obtained under the trade designation "OCEAN OPTICS" from Ocean Optics, Dunedin, Fla.).

Figure 1:
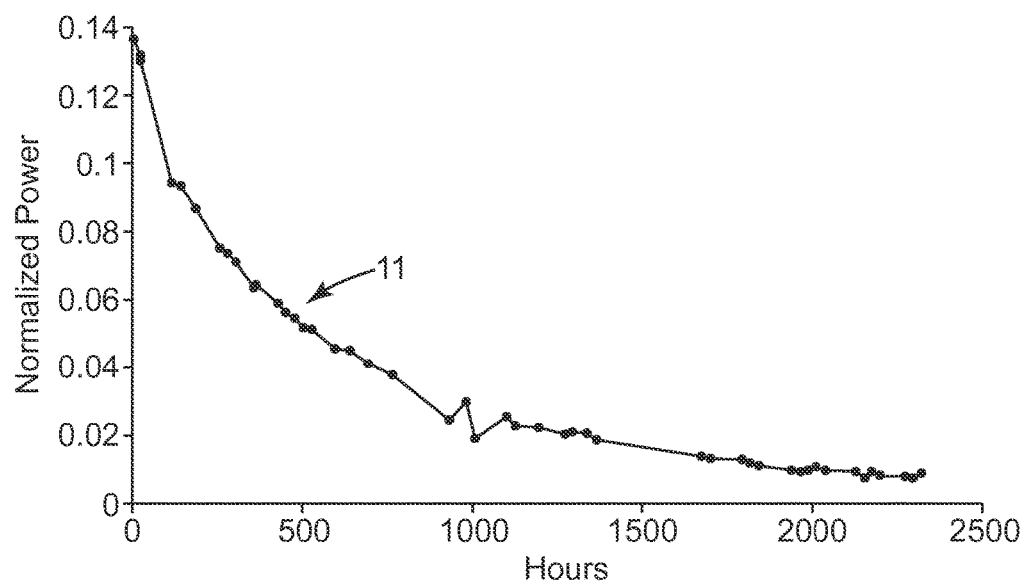
FIG. 1 is a plot of normalized green light emitted intensity versus time for Comparative A film.

The spectra were analyzed by calculating the integrated intensity for relevant emission bands (blue: 400-500 nm, green: 500-580 nm, red: 580-700 nm). Normalized green light intensity emitted from the film sample is plotted versus time (FIG. 1, curve 11). Continuous, relatively stable emission brightness indicates a high level of air stability. This standard film of quantum dot concentrate mixed directly in resin has poor air stability. The green emission was normalized by dividing by the unabsorbed blue excitation light. The blue light is relatively constant, but normalizing corrects for any spikes or drift.

Comparative Example B

Figure 2:
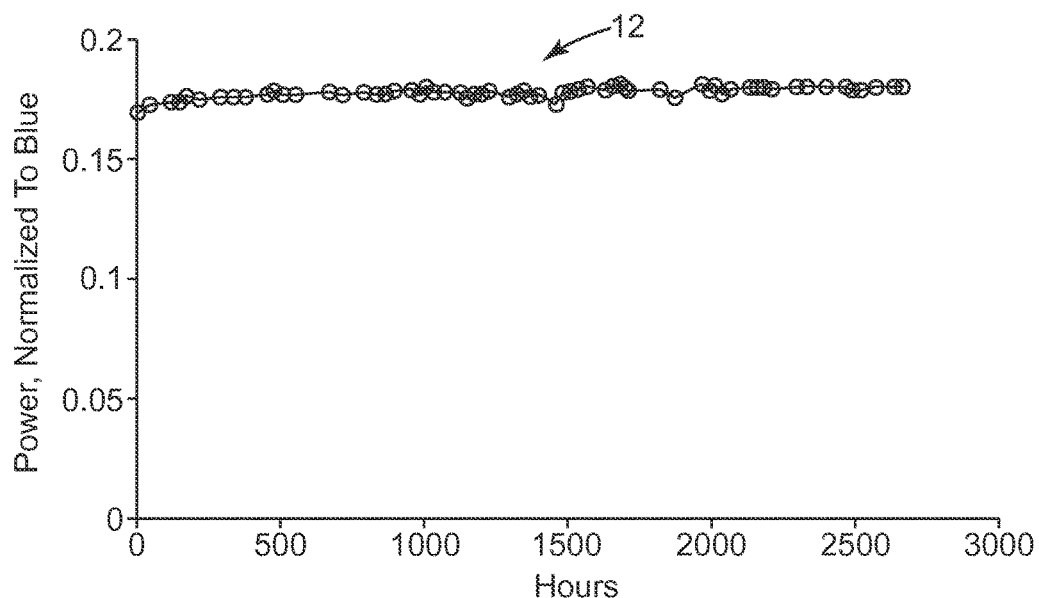
FIG. 2 is a plot of normalized green light emitted intensity versus time for Comparative B film.

A film was fabricated that as described for Comparative Example A, except that high barrier film was used instead of plain PET film. The high barrier film is PET coated with a structure having a thin layer of sputtered metal oxide which results in negligible transmission of oxygen and water vapor through the film. FIG. 2, curve 12 shows data obtained using the Ambient Life Test. The external quantum efficiency (EQE) was also measured for this sample, using an integrating sphere apparatus (obtained under the trade designation "HAMAMATSU QUANTAURUS" from Hamamatsu Photonics K.K., Hamamatsu City, Japan), and accompanying software (obtained under the trade designation "U6039-05" from Hamamatsu Photonics K.K.). Approximately 1 cm×1 cm film samples, and a 440 nm excitation wavelength were used for the measurements. An EQE value of 80.4% was obtained.

Example 1

A composite particle was made by infiltration of quantum dot concentrate into aerogel granules. Quantum dot concentrate as described in Comparative Example A was used, along with trimethylsilyloxy modified silica aerogel (obtained under the trade designation "ENOVA IC3100", from Cabot Corp., Billerica, Mass.). Four grams of aerogel was placed into glass vial. In another glass vial 10 grams of toluene was mixed with 12 grams of green CdSe based quantum dot concentrate. The diluted quantum dot concentrate was poured into the glass vial containing the aerogel. The sample was removed from the glove box and dried under vacuum at room temperature to remove the toluene. The dried sample was ground in a dry box using a mortar and pestle, and sieved to obtain a minus 150 micrometers particle size fraction.

APCVD Encapsulation

Three grams of the powder was microencapsulated with an amorphous aluminum oxide based material using a reaction of trimethyl aluminum (TMA; obtained under the trade designation "TRIMETHYL ALUMINUM IN BUBBLER, Lot Number 23403300" from Strem Chemicals, Newburyport, Mass.) and water vapor in a fluidized bed reactor. The reactor was a glass frit funnel tube 2 cm diameter by 18 cm tall. The reactor had an extended inlet tube from below the frit routed parallel to the body of the reactor, and an extended top area above the frit to allow the desired reactor height and fittings for a precursor injector tube and an exhaust outlet. Temperature was controlled at 120° C. using an oil bath. Nitrogen carrier gas was used with standard bubbler configurations for liquid precursors. The bubblers were at ambient temperature of about 22° C. Flow rates were 40 cm$^3$/minute through the TMA bubbler, and 400 cm$^3$/minute through the water bubbler. Total coating time was 5.5 hours.

Figure 3:
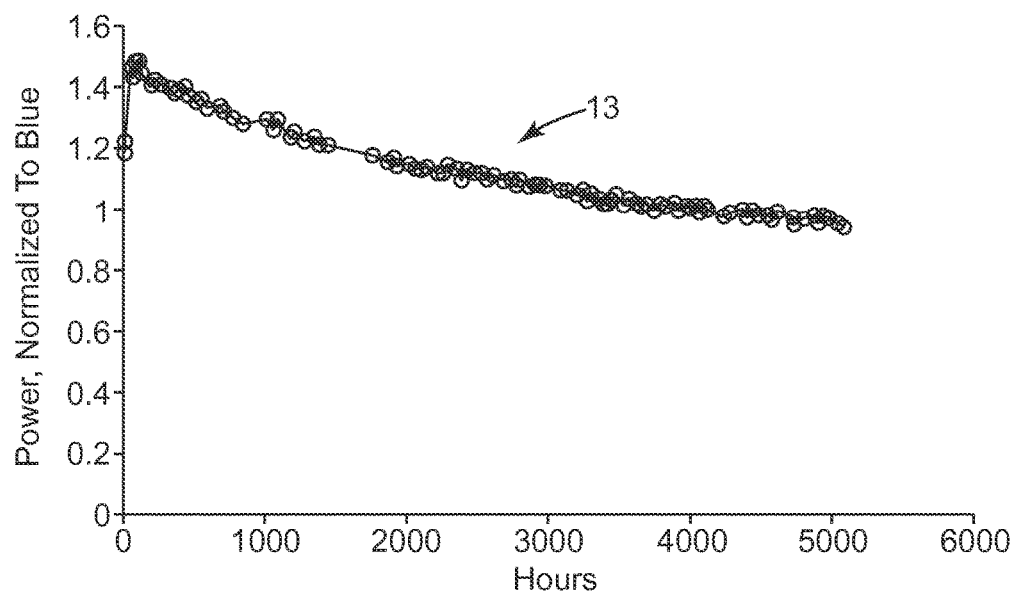
FIG. 3 is a plot of normalized green light emitted intensity versus time for Example 1 film.

A film sample was prepared using the materials and procedure described in Comparative Example A. In this case, 0.414 gram of encapsulated composite particles was mixed with 1.033 gram of the Part B resin and 2.246 gram of Part A resin in a glass vial to form the coating mixture, and used to produce a 100 micrometer coating between two sheets of plain PET, each 50 micrometer in thickness. The resulting sample was evaluated with the Air Stability Test, and the results plotted in FIG. 3. Normalized green light intensity emitted from the film sample is plotted versus time (FIG. 3, curve 13). After 1000 hours, the emitted intensity was about 105% of the initial value, and about 87% of the peak value. The intensity was still about 70% of the peak after 4000 hrs.

Example 2

Figure 4:
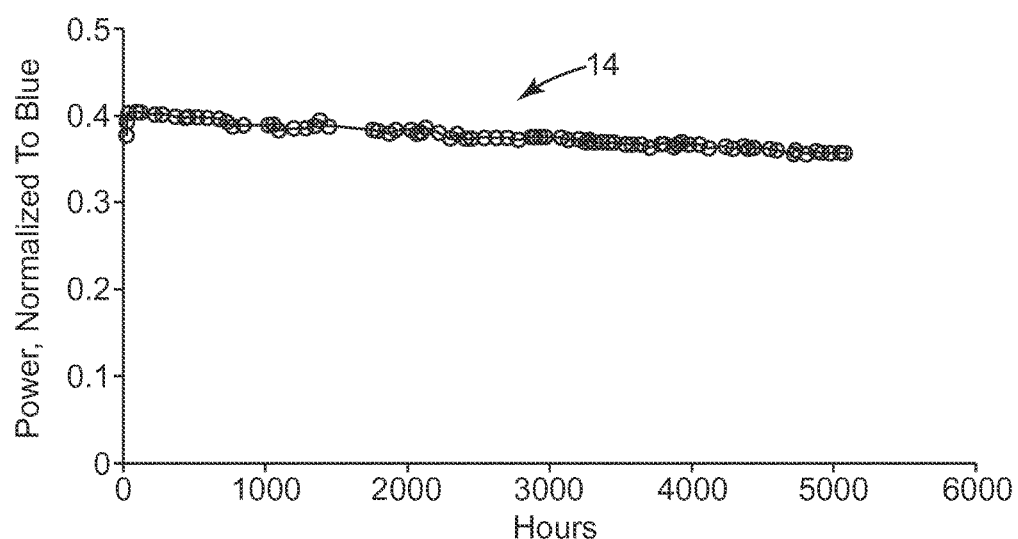
FIG. 4 is a plot of normalized green light emitted intensity versus time for Example 2 film.

A film was made using a portion of the same microencapsulated powder, and using the other materials and procedure as described in Example 1, except that high barrier substrate film was used as described in Comparative Example B. EQE was measured as described in Comparative Example B. A value of 61% was measured. The resulting sample was evaluated with the Air Stability Test, and the results plotted in FIG. 4. Normalized green light intensity emitted from the film sample is plotted versus time (FIG. 4, curve 14).

Comparative Example C

Figure 5:
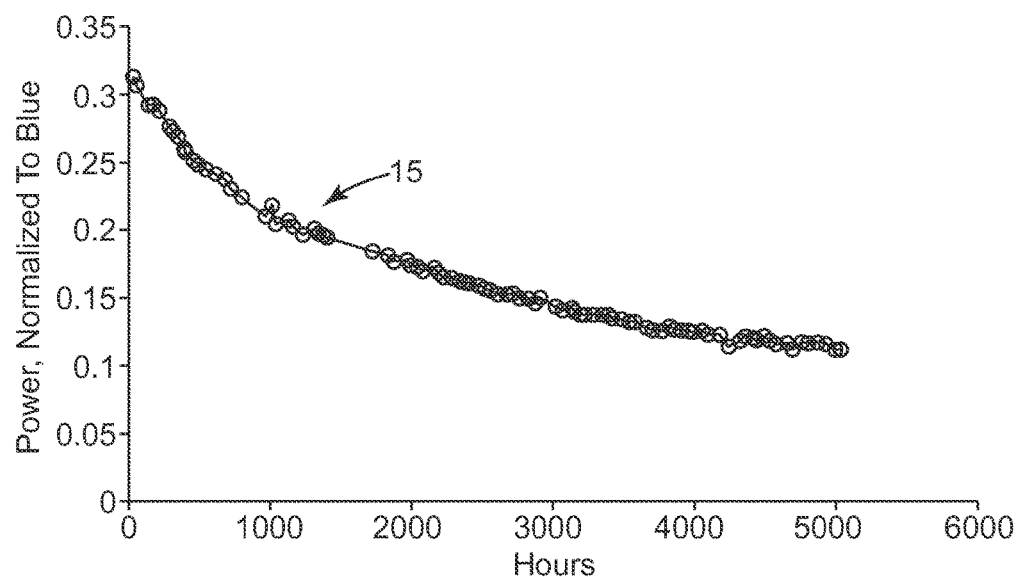
FIG. 5 is a plot of normalized green light emitted intensity versus time for Comparative C film.

A film was made using the same unencapsulated powder described in Example 1, using the same materials (including plain PET substrate film) and procedure. The resulting sample was evaluated with the Air Stability Test, and the results plotted in FIG. 5. Normalized green light intensity emitted from the film sample is plotted versus time (FIG. 5, curve 15).

Comparative Example D

A film was made using the same unencapsulated powder, and using the same materials and procedure described in Example 1, except that high barrier film was used as described in Comparative Example B. EQE was measured as described in Comparative Example B. A value of 61% was measured, indicating there was no change in EQE as a result of the microencapsulation process described in Example 1.

Example 3

Composite powder was made using the same materials and procedure described in Example 1. A 1 gram sample of the powder was microencapsulated using atomic layer deposition (ALD). A flow through atomic layer deposition (FTALD) reactor and 4 part sequential step process were used to deposit aluminum oxide ($Al_2O_3$) coatings through self-limiting surface reactions on the targeted particle material.

The four part sequential step process consisted of the following sequence: (1) Precursor A (i.e., trimethyl aluminum) pulse, (2) $N_2$ purge, (3) Precursor B (i.e., water vapor) pulse, and (4) $N_2$ purge. The 4 step sequence is referred to herein as 1 ALD cycle. The 1 gram of powder was processed using a total of 375 ALD cycles at a process temperature of 120° C. The sample chamber held the granules between two porous metal frits, with process gasses passing through the material from the bottom frit in such a manner to fluidize the sample. Fluidization was maintained using a continuous flow of nitrogen at a rate of 10 standard cubic centimeters (sccm), which also acted as the carrier gas for the two precursors. All gases were heated to 100° C. to assure the gas flow did not cool the sample.

The charge times and flow rates for each precursor varied in an attempt to maintain a consistent exposure of all sample particles to the reactive gases as measured by an residual gas analyzer (obtained under the trade designation "SRS RESIDUAL GAS ANALYZER" from Stanford Research Systems, Inc., Sunnyvale, Calif. 94089). The times and pressure changes for the TMA precursor varied (between 50 seconds and 5 seconds, with a pressure delta of 1 to 3 torrs in the reactor). The times and pressure changes for the water vapor varied between 5 seconds and 3 seconds with a pressure delta of 5 to 20 torrs.

Figure 6:
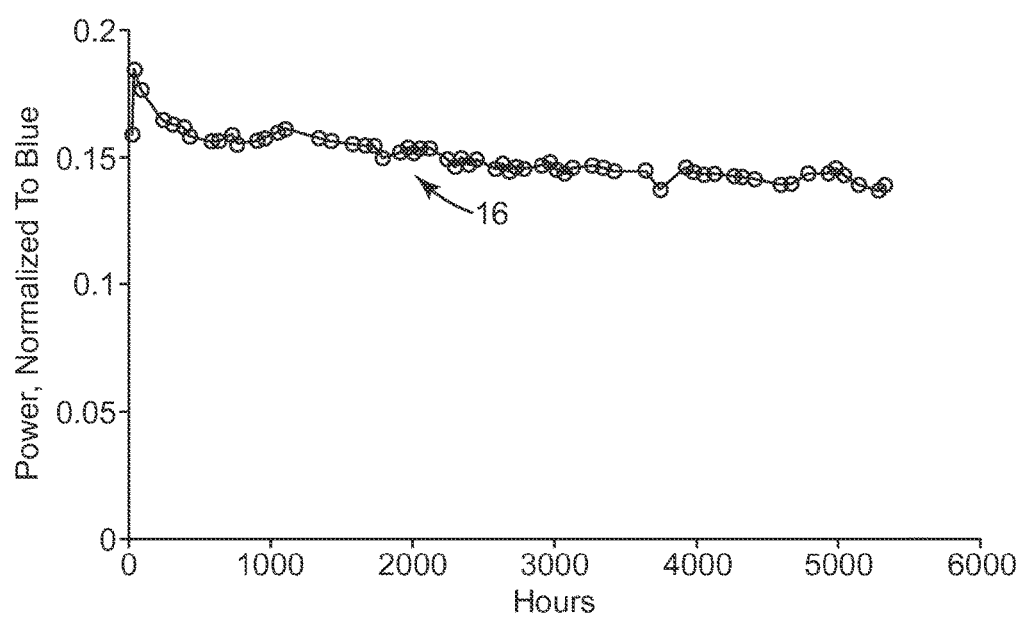
FIG. 6 is a plot of normalized green light emitted intensity versus time for Example 3 film.

A film sample was made using the ALD encapsulated powder, along with the same additional materials (including plain PET substrate film) and procedure described in Example 1. Ambient life testing was also performed as described in Comparative Example A. The resulting sample was evaluated with the Air Stability Test, and the results plotted in FIG. 6. Normalized green light intensity emitted from the film sample is plotted versus time (FIG. 6, curve 16). The sample had high air stability. After 1000 hours, the sample exhibited about 100% of initial intensity, and about 85% of peak.

Example 4

Figure 7:
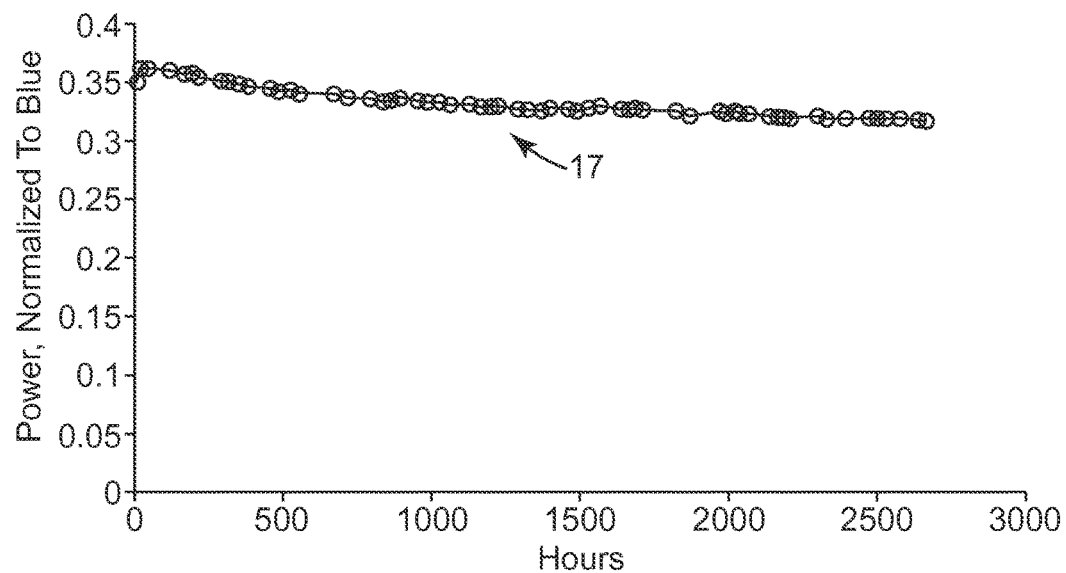
FIG. 7 is a plot of normalized green light emitted intensity versus time for Example 4 film.

A film was made using the microencapsulated powder described in Example 3, using the same materials and procedure, except that high barrier film was used as described in Comparative Example B. EQE was measured as described in Comparative Example B. A value of 59% was obtained. The resulting sample was evaluated with the Air Stability Test, and the results plotted in FIG. 7. Normalized green light intensity emitted from the film sample is plotted versus time (FIG. 7, curve 17). The stable emitted intensity shows that essentially no poisons were trapped in the particles (i.e., trapped substances did not cause significant brightness loss in a sample where external oxygen and moisture were excluded by high barrier substrate film).

Comparative Example E

A film was made using the unencapsulated powder described in Example 3, using the same materials and procedure, except that high barrier film was used as described in Comparative Example B. EQE was measured as described in Comparative Example B. A value of 62% was measured.

Example 5

Composite powder and film were made by infiltrating aerogel with quantum dot concentrate, encapsulating with APCVD, and coating and curing film as described in Example 2, except that the infiltrated powder was made with the following amounts of materials: Four grams of aerogel was placed into glass vial. In another glass vial 10 grams of toluene was mixed with 8 grams of green CdSe based quantum dot concentrate. EQE was measured as for Example 2, and was 67%.

Comparative Example F

A film was made using the unencapsulated powder described in Example 5, using the same materials and procedure. EQE was measured, and a value of 70% was obtained.

Comparative Example G

A film was made with unencapsulated powder and high barrier substrate as in Comparative Example C, except that the infiltrated powder was made with the following amounts of materials: Four grams of aerogel was placed into glass vial. In another glass vial 10 grams of toluene was mixed with 6 grams of green CdSe based quantum dot concentrate. In addition, the powder was milled in a mixer mill, (obtained under the trade designation "SPEX SAMPLE PREP 8000M MIXER MILL" from SPEX, Metuchen, N.J.), and a fraction was obtained by sieving to a size of minus 45 micrometers. EQE was measured as described for Example 2, and was 77%.

Example 6

Figure 8:
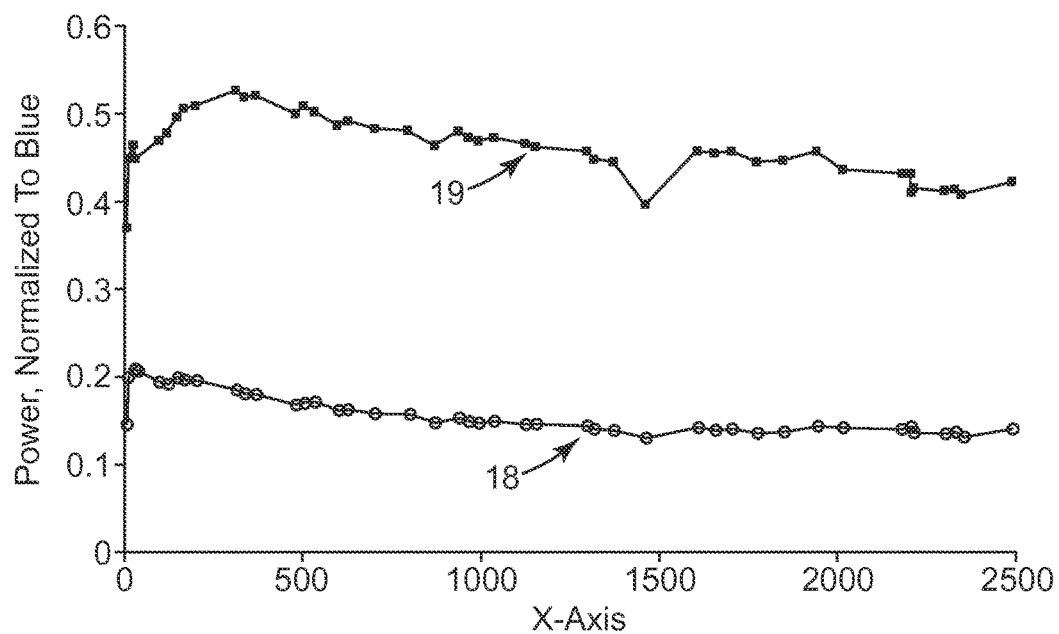
FIG. 8 is a plot of red and green light emitted intensity versus time for Example 6 film.

Composite powder was made from quantum dot concentrate and aerogel, encapsulated using ALD, and made into film samples for testing all as described in Example 3 except as follows. One gram of aerogel was placed into a glass vial. In another glass vial 2 grams of toluene was mixed with 3.15 grams of mixed red and green quantum dot concentrate (obtained as Part QCW1967-01 (Lot WF051012-01-L1) from Nanosys, Inc.). The diluted quantum dot concentrate was poured into the glass vial containing aerogel. The final mixture contained 1 gram of aerogel, 2.52 grams of toluene and 3.04 grams of the quantum dot concentrate. The sample was removed from the glove box and dried under vacuum at room temperature to remove the toluene. The four part sequential step ALD process consisted of the following sequence: (1) Precursor A (i.e., trimethyl aluminum) pulse, (2) $N_2$ purge, (3) Precursor B (i.e., ozone gas at 17% in oxygen) pulse, and (4) $N_2$ purge. 1 gram of powder was processed using a total of 605 ALD cycles at a process temperature of 60° C. The times and flow rates for the TMA precursor varied between 90 seconds and 30 seconds, and between 40 to 30 sccms, respectively, as measured by a mass flow controller. The flow rate of the ozone was held constant at 25 sccms with times varying between 90 seconds and 60 seconds. One gram of Part B resin and 2.1 grams of Part A resin were mixed together. The resin mixture was poured using a pipette onto 50 micrometer (2 mil) thick PET (with no barrier layer). Encapsulated powder was sprinkled onto the resin mixture. Another layer of PET film was added and a sandwich was formed which was cured for 2 days at ambient temperature. The resulting sample was evaluated with the Air Stability Test, and the results plotted in FIG. 8. Green and red emitted light intensities (FIG. 8 curves 18 and 19, respectively) are plotted versus time.

Comparative Example H 1.26 gram of aerogel as described in Example 1 was placed into glass vial. To this glass vial, 6.68 grams of green indium phosphide based quantum dot solution (obtained as Lot 321-93-3 from Nanosys, Inc.) was added. The InP based quantum dots were core-shell nanoparticles with dodecyl succinic acid ligand chemistry in toluene, with a relative solution optical density value of 10/mm. The sample was removed from the glove box and dried under vacuum at room temperature to remove the toluene, and ground and sieved as in Example 1. A film sample was made using 0.075 gram of powder mixed with 0.03 gram of Ethyl-2,4,6-trimethylbenzoylphenylphosphinate (obtained under the trade designation "LUCIRIN TPO-L" from BASF, Florham Park, N.J.) and 0.795 gram of resin in a glass vial. The resin was made by combining 49.5 parts by weight of bisphenol A epoxy diacrylate (obtained under the trade designation "CN104" from Arkema, King of Prussia, Pa.), 29.7 parts by weight of 2-phenoxyethylacrylate (obtained under the trade designation "EB114" from Allnex USA, Inc., Alpharetta, Ga.), and 19.8 parts by weight of tricyclodecane dimethanol diacrylate (obtained under the trade designation "SR833" from Sartomer, Exton, Pa.). The mixture was coated at a thickness of 100 micrometers (4 mil) using a knife coater between 50 micrometers (2 mil) thick sheets of high barrier films. The films were UV cured using a 385 nm LED light source (obtained from Clearstone Technologies Inc., Hopkins, Minn.), for 15 minutes at 50% power. EQE was measured and a value of 45% was obtained, which was approximately equal to standard films made from the InP quantum dots.

Examples 7-29

Powders were fabricated from silica powders described in Table 1, below, according the procedures described below. They were encapsulated using the APCVD process described in Example 1, except that the powder amount, flows, and temperature varied for different examples as indicated in Table 2, below.

TABLE 1

| Trade Designation | Shape and Particle Size, micrometers | Pore size, nanometers, and Pore volume, $cm^3/g$ | Source |
|---|---|---|---|
| "ENOVA IC3100" | Irregular, 2-40 | 20, 7-8 | Cabot, Billerica, MA |
| "DAVISIL XWP500" | Irregular, 35-70 | 50, 1.1 | Grace Davison Discovery Science, Deerfield, IL |
| "S10020M SILICYCLE" | Spherical, 20-45 | 30, 0.85 | SiliCycle, Inc., Quebec City, Canada |
| "DAVISIL LC250A" | Irregular, 40-63 | 25, 1.8 | Grace Davison Discovery Science |
| "DAVISIL XWP1000" | Irregular, 16-24 | 100, 1.1 | Grace Davison Discovery Science |

TABLE 2

| Example # | Coating ID | Powder ID | Powder Weight, g | Temp., °C. | Multiple steps? | $H_2O$ flow rate, $cm^3$/min. | TMA flow rate, $cm^3$/min. | Approximate $H_2O$/TMA precursor ratio at 20° C. | Coating time, hr:min. | % Brightness retained after 1000 hr. | EQE |
|---|---|---|---|---|---|---|---|---|---|---|---|
| 7 | DH45 | CA16 | 2.5 | 180 | NO | 100 | 100 | 2 | 4:40 | 97 | 66 |
| 8 | DH54 | CA19 | 2.0 | 180 | STEP1 | 120 | 23 | 10 | 3:00 | | |
| | | | | | STEP2 | 100 | 100 | 2 | 2:55 | 100 | 41 |
| 9 | DH56 | CA19 | 2.0 | 180 | STEP1 | 300 | 100 | 6 | 1:45 | | |
| | | | | | STEP2 | 250 | 100 | 5 | 1:25 | | |
| | | | | | STEP3 | 200 | 100 | 4 | 1:25 | | |
| | | | | | STEP4 | 150 | 100 | 3 | 1:00 | | |
| | | | | | STEP5 | 100 | 100 | 2 | 1:35 | 98 | 47 |
| 10 | DH57 | CA19 | 2.0 | 180 | NO | 140 | 70 | 4 | 5:15 | 55 | 79 |
| 11 | DH61 | CCS2 | 2.5 | 180 | NO | 100 | 100 | 2 | 4:30 | 86 | 50 |
| 12 | DH62 | CCS2 | 2.5 | 180 | NO | 150 | 100 | 3 | 4:40 | 92 | 56 |
| 13 | DH67 | CCS1 | 2.7 | 180 | NO | 150 | 100 | 3 | 5:00 | 96 | 64 |
| 14 | DH68 | CCS2 | 2.5 | 180 | NO | 200 | 100 | 4 | 5:10 | 93 | 72 |
| 15 | DH69 | CCS2 | 2.6 | 180 | NO | 250 | 100 | 5 | 4:30 | 95 | 71 |
| 16 | DH70 | CCS2 | 2.5 | 180 | NO | 175 | 100 | 3.5 | 5:00 | 94 | 67 |
| 17 | DH71 | CCS2 | 2.6 | 180 | NO | 225 | 100 | 4.5 | 4:35 | 91 | 75 |
| 18 | DH72 | CCS2 | 2.5 | 180 | NO | 350 | 70 | 10 | 5:10 | 11 (500 h) | 87 |
| 19 | DH73 | CCS8 | 2.5 | 180 | NO | 250 | 100 | 5 | 4:55 | 90 | 77 |
| 20 | DH74 | CCS8 | 2.5 | 180 | NO | 350 | 70 | 10 | 4:45 | 65 | 72 |
| 21 | DH75 | CCS8 | 2.6 | 180 | NO | 175 | 100 | 3.5 | 4:50 | 92 | 63 |
| 22 | DH76 | CCS9 | 2.5 | 180 | NO | 250 | 100 | 5 | 4:30 | 81 | 74 |
| 23 | DH77 | CCS9 | 2.5 | 180 | NO | 175 | 100 | 3.5 | 4:35 | 96 | 65 |
| 24 | DH78 | CCS9 | 2.5 | 200 | NO | 175 | 100 | 3.5 | 4:30 | 92 (500 h) | 76 |
| 25 | DH79 | CCS9 | 2.4 | 180 | STEP1 | 350 | 0 | N/A | 1:10 | | |
| | | | | | STEP2 | 350 | 70 | 10 | 1:00 | | |
| | | | | | STEP3 | 350 | 100 | 7 | 1:32 | | |
| | | | | | STEP4 | 250 | 100 | 5 | 0:58 | | |
| | | | | | STEP5 | 175 | 100 | 3.5 | 1:28 | 86 (500 h) | 75 |
| 26 | DH80 | CCS10 | 2.5 | 200 | NO | 225 | 100 | 4.5 | 4:55 | 87 (500 h) | 78 |
| 27 | DH81 | CCS10 | 2.5 | 180 | STEP1 | 250 | 0 | N/A | 1:00 | | |
| | | | | | STEP2 | 175 | 100 | 3.5 | 4:30 | 98 (500 h) | 74 |

TABLE 2-continued

| Example # | Coating ID | Powder ID | Powder Weight, g | Temp., °C. | Multiple steps? | H₂O flow rate, cm³/min. | TMA flow rate, cm³/min. | Approximate H₂O/TMA precursor ratio at 20° C. | Coating time, hr:min. | % Brightness retained after 1000 hr. | EQE |
|---|---|---|---|---|---|---|---|---|---|---|---|
| 28 | DH82 | CCS10 | 2.5 | 180 | STEP1 | 250 | 0 | N/A | 1:05 | | |
| | | | | | STEP2 | 225 | 100 | 5 | 4:45 | 88 (500 h) | 78 |
| 29 | DH83 | CCS10 | 2.5 | 180 | STEP1 | 250 | 0 | N/A | 1:05 | | |
| | | | | | STEP2 | 175 | 100 | 3.5 | 1:35 | | |
| | | | | | STEP3 | 250 | 100 | 5 | 0:55 | | |
| | | | | | STEP4 | 350 | 100 | 7 | 1:25 | | |
| | | | | | STEP5 | 350 | 70 | 10 | 1:10 | 98 (500 h) | 72 |

Films were made from the powders as described below. Ambient life testing was conducted as described in Example 1. EQE was measured as described in Example 1. Process conditions, ambient life test results, and EQE values are given in Table 1, above.

CA-16 Powder 10 grams of silica aerogel ("ENOVA IC3100") was taken in a glass jar. In another glass vial 40 grams of toluene was mixed with 15 grams of green quantum dot concentrate (obtained as Lot #QCG052214-24, Part # QCEF52035R2-01 from Nanosys, Inc.). The diluted quantum dot concentrate was poured in to the glass jar containing aerogel, slowly drop by drop. All were mixed well and scraped and left for a day. The sample was removed from the glove box and dried under vacuum at room temperature to remove the toluene. The drying was continued for 2 days. The sample was ground and sieved to −75 micrometer particle size.

CA-19 Powder

CA-19 powder was prepared the same as CA-16 powder, except drying was continued for 7 days.

CCS1 Powder 6 grams of chromatographic silica ("DAVISIL XWP500"; 35-70 micrometer particles size, 500 angstrom pore size) was taken in a glass vial. To this chromatographic silica was added a premixed solution of 5.85 grams of green quantum dot concentrate (obtained as Lot #QCG052214-24, Part # QCEF52035R2-01 from Nanosys, Inc.) and 0.65 gram of ethanol (dry absolute). After mixing well the resulting material was removed from the glove box and dried under vacuum at room temperature to remove the ethanol. The dried powder was sieved using −75 micrometer sieve.

CCS-2 Powder 15 grams of spherical silica ("S10020M SILICYCLE"; 20-45 micrometer particles size, 300 angstrom pore size) was taken in a glass vial. To this chromatographic silica was added a premixed solution of 12.5 grams of green quantum dot concentrate (obtained as Lot #QCG052214-24, Part # QCEF52035R2-01 from Nanosys, Inc.) and 3.0 grams of ethanol (dry absolute). After mixing well the resulting material was removed from the glove box in a closed container and dried under vacuum at room temperature to remove the ethanol. Dried composite powder was ground and sieved using −45 micrometer sieve.

CCS-8 Powder 6 grams of chromatographic silica ("DAVISIL LC250A"; 40-63 micrometer particles size, 250 angstrom pore size) was taken in a glass vial. To this chromatographic silica was added a premixed solution of 7.65 grams of green quantum dot concentrate (obtained as Lot #QCG052214-24, Part # QCEF52035R2-01 from Nanosys, Inc.) and 1.52 gram of ethanol (dry absolute). After mixing well the resulting material was removed from the glove box and dried under vacuum at room temperature to remove the ethanol. The dried composite powder was sieved with a −75 micrometer sieve.

CCS-9 Powder 6 grams of chromatographic silica ("DAVISIL XWP1000A"; 16-24 micrometer particles size, 1000 angstrom pore size) was taken in a glass vial. To this chromatographic silica was added a premixed solution of 5.5 grams of green quantum dot concentrate (obtained as Lot #QCG052214-24, Part # QCEF52035R2-01 from Nanosys, Inc.) and 0.5 gram of ethanol (dry absolute). After mixing well the resulting material was removed from the glove box and dried under vacuum at room temperature to remove the ethanol. The dried composite powder was sieved using a −45 micrometer sieve.

CCS-10 Powder 9 grams of chromatographic silica "DAVISIL XWP1000A"; 16-24 micrometer particles size, 1000 angstrom pore size) was taken in a glass vial. To this chromatographic silica was added a premixed solution of 8.3 grams of green quantum dot concentrate (obtained as Lot #QCG052214-24, Part # QCEF52035R2-01 from Nanosys, Inc.) and 1 gram of ethanol (dry absolute). After mixing well the resulting material was removed from the glove box and dried under vacuum at room temperature to remove the ethanol. The dried composite powder was sieved using a −45 micrometer sieve.

CCS-11 Powder 13.5 grams of chromatographic silica "DAVISIL XWP1000A": 16-24 micrometer particles size, 1000 angstrom pore size) was taken in a glass vial. To this chromatographic silica was added a premixed solution of 12.5 grams of green quantum dot concentrate (obtained as Lot #QCG052214-24, Part # QCEF52035R2-01 from Nanosys, Inc.) and 2 grams of ethanol (dry absolute). After mixing well the resulting material was removed from the glove box and dried under vacuum at room temperature to remove the ethanol. The dried composite powder was sieved using a −45 micrometer sieve.

Film Preparation

The formulations shown in Table 2 (above) were mixed with a stirring stick and coated between two pieces of condor barrier films and/or two pieces of regular PET films (with no barrier layer). The thickness of coated layer was 100 micrometers (4 mil) and total thickness of 200 micrometers (8 mil) overall. All the coatings prepared were UV cured using 385 nm light emitting diodes (LED) light source (obtained from Clearstone Tech. under the trade designation "CF200 100-240V 6.0-3.5 A"; 50-60 Hz) for 30 seconds at 50% power. Followed by UV-curing the coatings were further cured in an oven for 10 minutes at 100° C.

Comparative Examples I-O

Films were also made from unencapsulated samples of the powders described above and tested (ambient life test and EQE test) as described above. Results are summarized in Table 3, below. Most sample were removed from the ambient life test in less than 1000 hours due to the greater rate of brightness loss.

TABLE 3

| Comp. Example # | Powder ID | % Brightness retained (time) | EQE, % |
| --- | --- | --- | --- |
| I | CA16 | 22% (480 h) | 87 |
| J | CA19 | data not obtained | 83 |
| K | CCS1 | 1% (1000 h) | 84 |
| L | CCS2 | 12% (410 h) | 79 |
| M | CCS8 | 16% (580 h) | 84 |
| N | CCS9 | 2% (580 h) | 88 |
| O | CCS10 | 19% (290 h) | 88 |

Foreseeable modifications and alterations of this disclosure will be apparent to those skilled in the art without departing from the scope and spirit of this invention. This invention should not be restricted to the embodiments that are set forth in this application for illustrative purposes.

What is claimed is:

1. A particle comprising a composite core and a continuous inorganic coating covering the composite core, wherein the composite core comprises a continuous non-metallic inorganic matrix, ligands, and quantum dots, wherein the matrix comprises up to 40 volume percent, wherein the coating has an average thickness up to 5 micrometers, and wherein at least 60 volume percent of the particle is collectively the ligands and the quantum dots, based on the total volume of the composite core.

2. The particle of claim 1, wherein the matrix comprises at least one of silica or metal oxide.

3. The particle of claim 1, wherein the matrix is aerogel.

4. The particle of claim 1, wherein the composite core comprises a mesoporous structure.

5. A film comprising a plurality of particles of claim 1.

6. The film of claim 5 further comprising polymer.

7. The film comprising the particle of claim 5, wherein the film exhibits external quantum efficiencies greater than 50.

8. A particle comprising a composite core and a continuous inorganic coating covering the composite core, wherein the composite core comprises a continuous non-metallic inorganic matrix, ligands, and quantum dots, wherein the matrix comprises up to 40 volume percent, wherein the coating has an average thickness up to 5 micrometers, wherein the composite core further comprises a liquid, and wherein greater than 60 volume percent of the particle is collectively the liquid, the ligands, and the quantum dots, based on the total volume of the composite core.

9. The particle of claim 8, wherein the liquid has vapor pressure at 25° C. of greater than 1 torr.

10. A particle comprising a composite core and a continuous inorganic coating covering the composite core, wherein the composite core comprises a continuous non-metallic inorganic matrix, ligands, and quantum dots, wherein the matrix comprises up to 40 volume percent, wherein the coating has an average thickness up to 5 micrometers, and wherein the particle has air stable light emission properties.

11. A method of making a particle comprising a composite core and a continuous inorganic coating covering the composite core, wherein the composite core comprises a continuous non-metallic inorganic matrix, ligands, and quantum dots, wherein the matrix comprises up to 40 volume percent, wherein the coating has an average thickness up to 5 micrometers, the method comprising:
providing a liquid having quantum dots dispersed therein;
infiltrating the liquid having the quantum dots into a porous inorganic particle; and
encapsulating the infiltrated particle with a continuous inorganic coating to provide the particle.

12. The method of claim 11, wherein encapsulating the infiltrated particle with a continuous inorganic coating is done via at least one of chemical vapor deposition, atomic layer deposition, sputtering, or evaporation.

13. The method of claim 12, wherein encapsulating the infiltrated particle with an inorganic high barrier material coating is done via chemical vapor deposition not exceeding a temperature of chemical vapor deposition of 220° C.

14. The method of claim 13, wherein the deposition includes reacting a metal oxide precursor comprising at least one metal cation and a co-reactant to the metal oxide precursor and wherein the ratio of metal oxide precursor to the co-reactant is changed at least once during the process.

15. The method of claim 11, wherein encapsulating the infiltrated particle with the inorganic high barrier coating is done at a pressure of at least 0.5 atmosphere.

* * * * *